(12) United States Patent
Shaw et al.

(10) Patent No.: US 12,538,411 B1
(45) Date of Patent: Jan. 27, 2026

(54) PRINTED CIRCUIT BOARD WITH INTEGRATED AXIAL FLUX MOTOR COOLING APPARATUS

(71) Applicant: E-Circuit Motors, Inc., Needham Heights, MA (US)

(72) Inventors: Steven Robert Shaw, Bozeman, MT (US); George Harder Milheim, Bozeman, MT (US); Mark Puglia, Brookline, MA (US)

(73) Assignee: E-Circuit Motors, Inc., Needham Heights, MA (US)

( * ) Notice: Subject to any disclaimer, the term of this patent is extended or adjusted under 35 U.S.C. 154(b) by 0 days.

(21) Appl. No.: 19/260,922

(22) Filed: Jul. 7, 2025

Related U.S. Application Data

(60) Provisional application No. 63/798,813, filed on May 2, 2025.

(51) Int. Cl.
| | |
|---|---|
| H05K 1/02 | (2006.01) |
| H02K 1/18 | (2006.01) |
| H02K 3/26 | (2006.01) |
| H02K 11/00 | (2016.01) |
| H02K 21/24 | (2006.01) |

(52) U.S. Cl.
CPC .......... *H05K 1/0203* (2013.01); *H02K 1/182* (2013.01); *H02K 3/26* (2013.01); *H02K 11/0094* (2013.01); *H02K 21/24* (2013.01); *H02K 2211/03* (2013.01); *H05K 2201/064* (2013.01); *H05K 2201/1009* (2013.01); *H05K 2201/10212* (2013.01)

(58) Field of Classification Search
CPC .......... H05K 1/0203; H05K 2201/064; H05K 2201/1009; H05K 2201/10212; H02K 1/182; H02K 3/26; H02K 11/0094; H02K 21/24; H02K 2211/03
See application file for complete search history.

(56) References Cited

U.S. PATENT DOCUMENTS

| | | | |
|---|---|---|---|
| 7,109,625 | B1 | 9/2006 | Jore et al. |
| 9,673,688 | B2 | 6/2017 | Shaw |
| 9,800,109 | B2 | 10/2017 | Shaw |
| 10,170,953 | B2 | 1/2019 | Shaw |
| 10,211,694 | B1 | 2/2019 | Shaw |
| 11,005,322 | B2 | 5/2021 | Milheim et al. |
| 11,121,614 | B2 | 9/2021 | Milheim |
| 11,336,130 | B1 | 5/2022 | Shaw et al. |
| 11,482,908 | B1 | 10/2022 | Guedes-Pinto et al. |
| 11,527,933 | B2 | 12/2022 | Shaw et al. |
| 11,626,779 | B2 | 4/2023 | Shaw et al. |
| 11,751,330 | B2 | 9/2023 | Milheim et al. |
| 2020/0313520 | A1 | 10/2020 | Quick et al. |

(Continued)

FOREIGN PATENT DOCUMENTS

| | | |
|---|---|---|
| EP | 2863524 A1 | 4/2015 |
| WO | 2023215797 A1 | 11/2023 |
| WO | 2024125789 A1 | 6/2024 |

*Primary Examiner* — Jeremy C Norris
(74) *Attorney, Agent, or Firm* — Pierce Atwood LLP

(57) ABSTRACT

An apparatus may include a host circuit board supporting a heat-producing electronic component, a rotor for an axial flux motor, and fan blades supported by the rotor. The host circuit board may include traces forming windings for the axial flux motor. The rotor may be supported by and rotatable relative to the host circuit board to generate a flow of cooling fluid to cool the first heat-producing electronic component.

30 Claims, 5 Drawing Sheets

(56) References Cited

U.S. PATENT DOCUMENTS

| | | |
|---|---|---|
| 2023/0396130 A1 | 12/2023 | Liu et al. |
| 2024/0072591 A1 | 2/2024 | Mandel et al. |
| 2025/0047148 A1 | 2/2025 | Semidey et al. |
| 2025/0079922 A1 | 3/2025 | Lee et al. |

US 12,538,411 B1

PRINTED CIRCUIT BOARD WITH INTEGRATED AXIAL FLUX MOTOR COOLING APPARATUS

RELATED APPLICATIONS

This application claims the benefit under 35 U.S.C. § 119 (e) of U.S. Provisional Application Ser. No. 63/798,813, entitled PRINTED CIRCUIT BOARD WITH INTEGRATED AXIAL FLUX MOTOR COOLING APPARATUS, filed May 2, 2025, the entire contents of which are incorporated herein by reference for all purposes.

BACKGROUND

Axial flux motors and generators described by several patents, including U.S. Pat. Nos. 7,109,625; 9,673,688; 9,800,109; 10,170,953; 10,211,694; 11,005,322; 11,121, 614; 11,336,130; 11,527,933; 11,626,779; 11,751,330, the entire contents of which are incorporated herein by reference, feature a generally planar printed circuit board stator (PCB) assembly interposed between magnets magnetized with alternating north-south poles. Machines built according to the teachings of these patents and related art have stators that are built using printed circuit board techniques. These stators, and the associated energy conversion devices, can be made axially thin.

DETAILED DESCRIPTION

Figure 1:
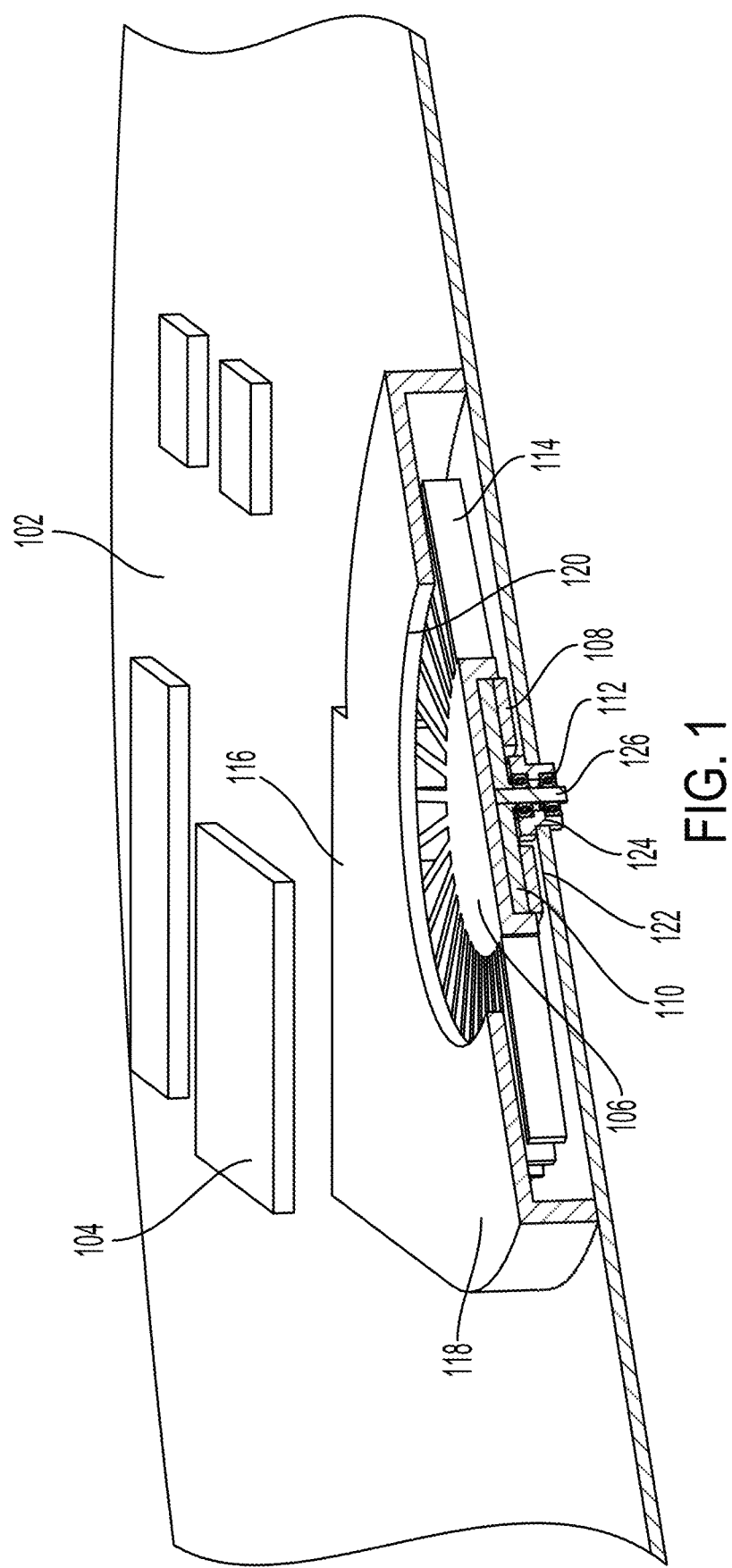
FIG. 1 shows a cross-sectional view of an assembly in which windings of a stator for an axial flux motor are integrated with a host circuit board that also supports one or more to-be-cooled components, and in which a rotor for the axial flux motor and an associated fan are assembled to the host circuit board.

In accordance with some aspects of the present disclosure, an axial flux motor for a cooling pump (e.g., a fan) may be integrated onto a host printed circuit board that also supports one or components (e.g., graphics processing units (GPUs), central processing units (CPUs), or similar electronic circuits) in need of cooling. For instance, as illustrated in FIGS. 1-5, in some implementations, a host circuit board 102 including one or more to-be-cooled component(s) 104 may include circuit traces 122 (shown best in FIG. 2) that form windings for one or more poles of a stator of an axial flux motor and a rotor 106 for the axial flux motor (e.g., including one or more permanent magnets 108 attached to a back-iron component 110) may be spaced axially from the stator windings and rotatably supported with respect to host circuit board 102 (which includes the circuit traces 122 that form the stator windings). The host circuit board 102 may be formed using conventional printed circuit board fabrication techniques and technologies.

In some implementations, the circuit traces 122 may be organized to present a radial current density (carried by radial traces) to interact with the axial magnetic flux generated by the permanent magnet(s) 108 of the rotor 106. The portion of the host circuit board 102 with such radial features, i.e., the annular region extending between a radial distance r1 (measured from the axis of rotation of the rotor 106) and a radial distance r2 (also measured from the axis of rotation of the rotor 106), is located within the "active" region of the axial flux motor, in the sense that it is primarily responsible for the production of torque in the motor. The inner and outer radii of the permanent magnet(s) 108 attached to the rotor 106 may be positioned at or near the radial distance r1 and the radial distance r2, respectively, thus creating axially directed magnetic flux within the annular active region. The remaining features, e.g., "end turns" radially adjacent the annular active region, may exist only to connect the radial portions in series and parallel combinations and convey the associated currents and voltages to terminals of the axial flux motor.

Figure 2:
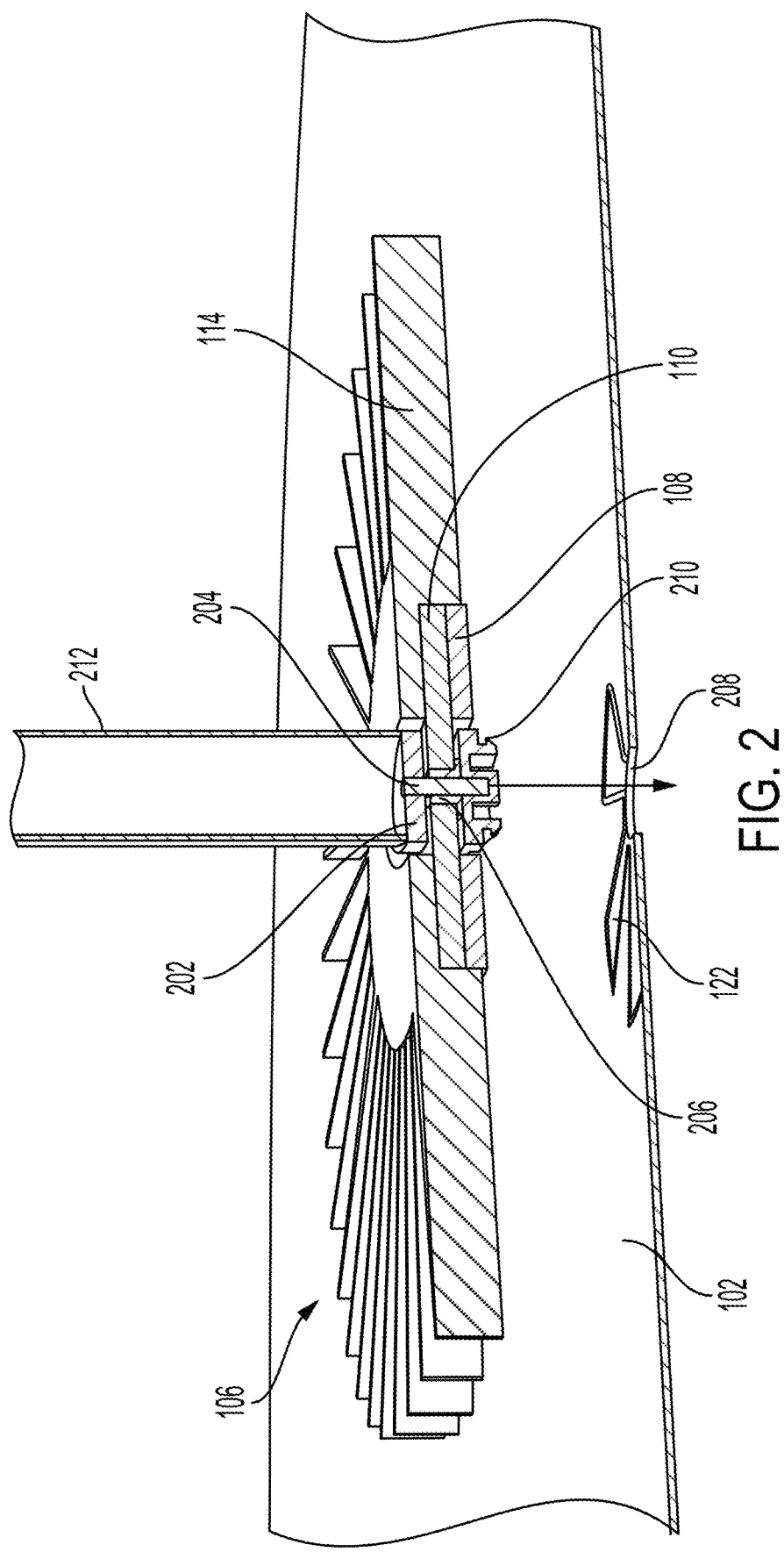
FIG. 2 shows how an assembly like that shown in FIG. 1 may be formed by using a pick-and-place technique to install a standardized rotor/fan component onto a host circuit board that includes windings for an axial flux motor, which host circuit board may also include one or more to-be-cooled components.
Figure 3:
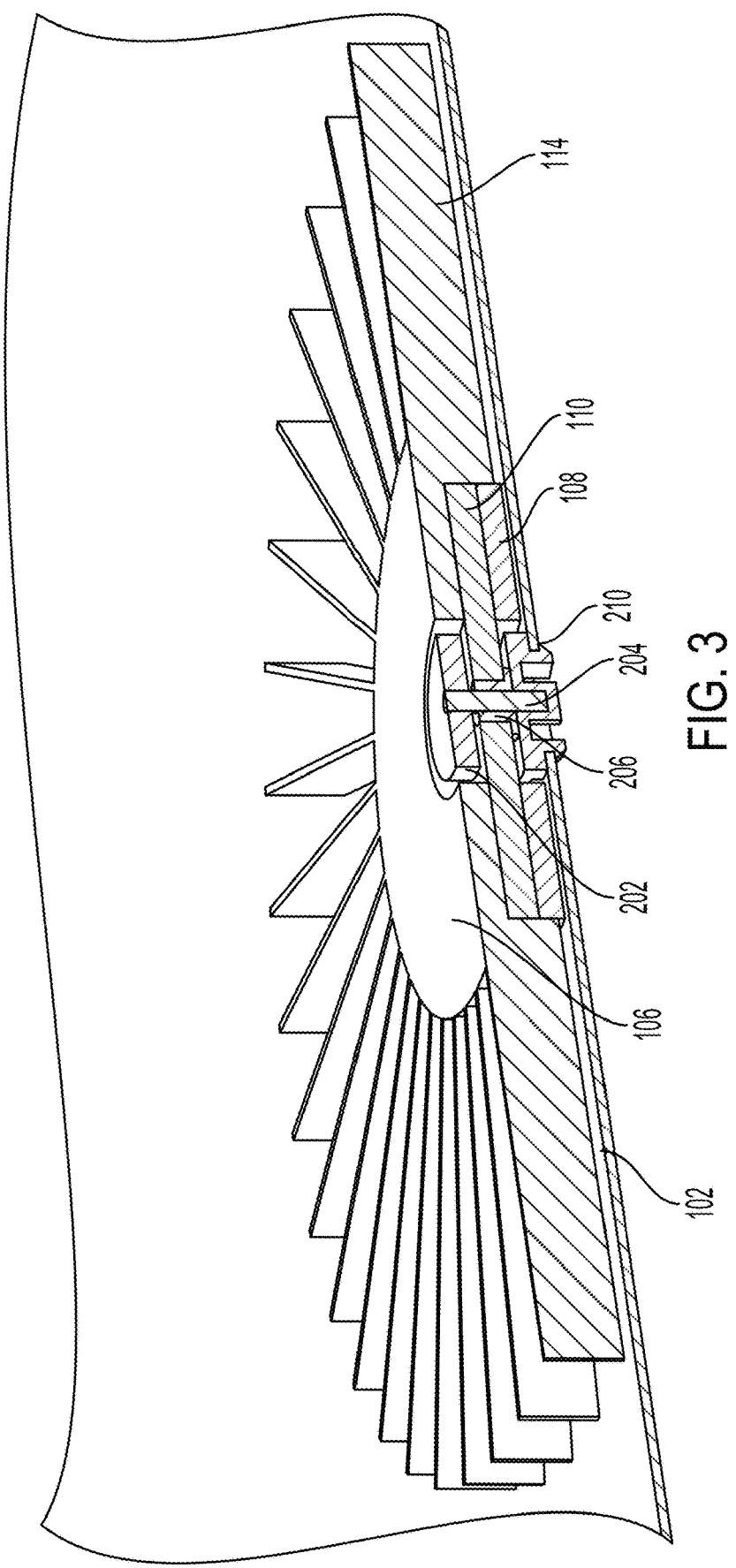
FIG. 3 illustrates how a completed assembly (including a host circuit board and a rotor/fan assembly) may appear following the pick-and-place process illustrated in FIG. 2.
Figure 4:
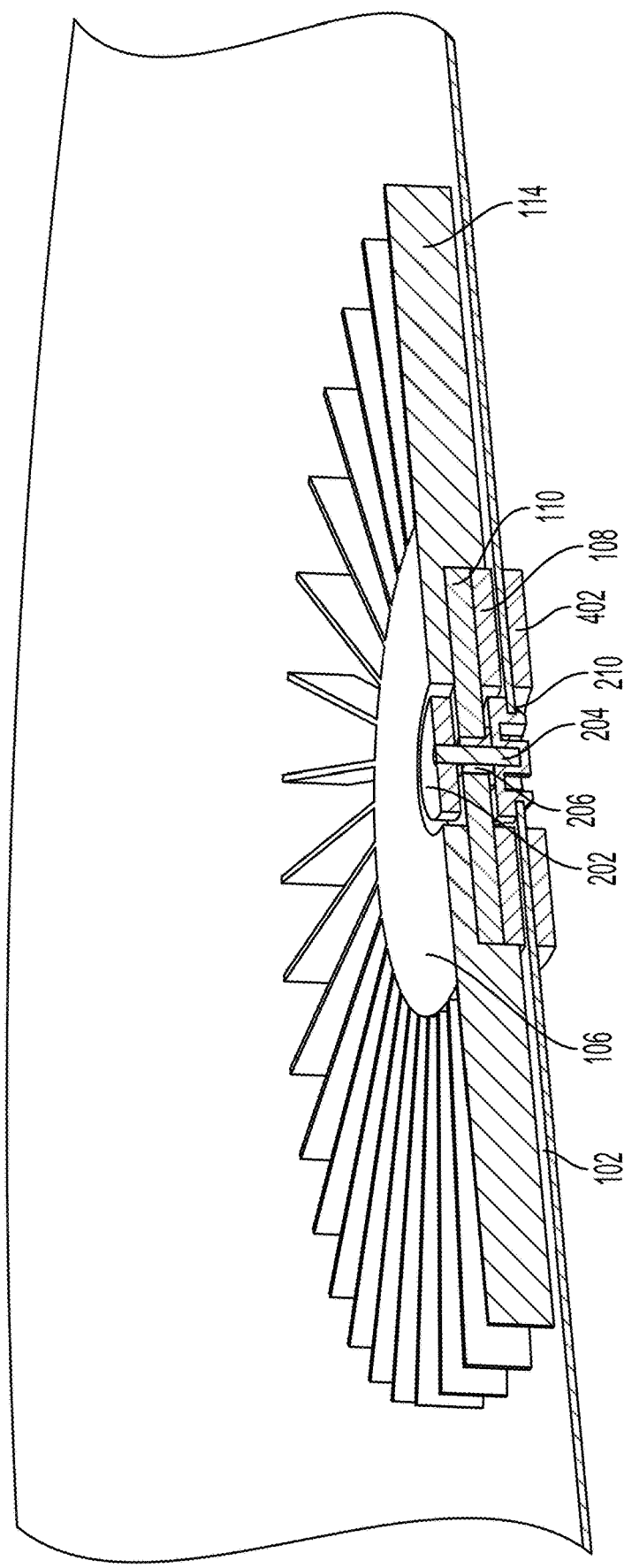
FIG. 4 shows a completed assembly similar to that shown in FIG. 3, but in which the host printed circuit board has a back-iron component placed on a side of the host printed circuit board that faces away from the rotor/fan assembly.
Figure 5:
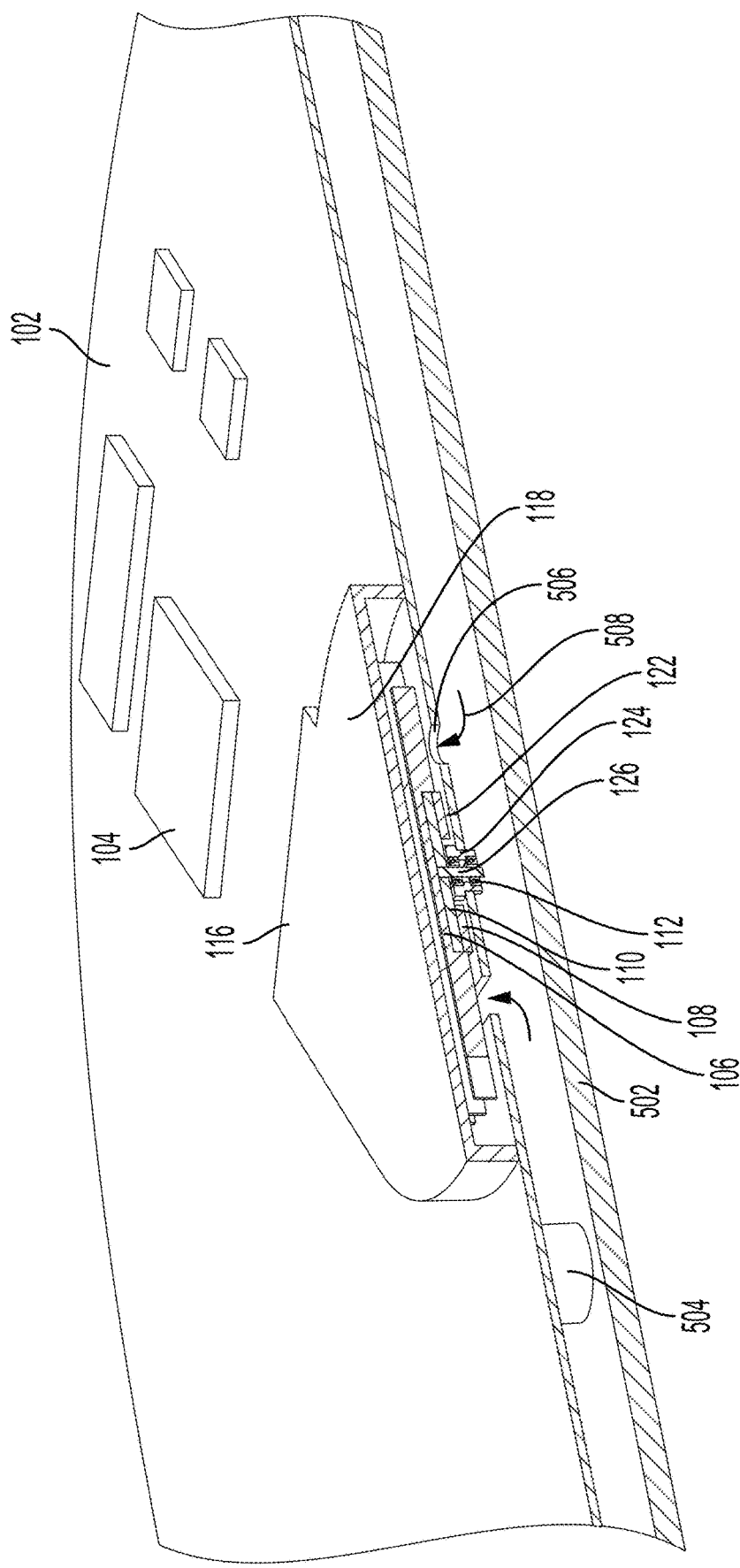
FIG. 5 shows an assembly similar to that shown in FIG. 1, but in which the host circuit board, rather than the shroud, includes one or more openings through which air may be drawn into the fan.

As shown in FIGS. 1 and 5, in some implementations, a hub component 124 may be fixedly attached to the host circuit board 102 and the rotor 106 may be fixedly attached to a shaft 126, with bearings 112 within the hub component 124 allowing the shaft 126 to rotate within the hub component 124. As shown in FIGS. 2-4, in other implementations, a hub component 202 (including a stationary shaft 204) may be fixedly attached to the host circuit board 102 and a sleeve bearing 206 or similar component may allow the rotor 106 to rotate relative to the stationary shaft 204. Other configurations for allowing the rotor 106 to rotate relative to the host circuit board 102 (and stator windings) are also possible.

In some implementations, the rotor 106 may include one or more fan blades 114 that generate a flow of fluid (e.g., air) to cool the component(s) 104. In the illustrated embodiments, the fan blades 114 are straight and are positioned on the rotor 106 so as to form a centrifugal (radial) fan that generates fluid flow (e.g., air flow) in a radial direction (e.g., parallel to a surface of the host circuit board 102). In other implementations, one or more fan blades may additionally or alternatively include air foil features and/or may additionally or alternatively be positioned on the rotor 106 so as to form an axial fan that generates fluid flow (e.g., air flow) in an axial direction (e.g., normal to a surface of the host circuit board 102).

In some implementations, one or more additional components may also be provided on the host circuit board 102 to shroud the fluid pump (e.g., fan) and direct the fluid flow generated by the fan blades 114 to the to-be-cooled components 104. For example, as illustrated in FIGS. 1 and 5, a shroud 118 may at least partially cover the rotor components and a duct 116 may extend from the shroud 118 toward the to-be-cooled component(s) 104 on the host circuit board 102 to direct the flow of fluid (e.g., air) to such component(s) 104.

As illustrated in FIG. 1, in some implementations, such a shroud 118 may include one or more openings 120 to allow the inflow of fluid (e.g., air) to the shroud 118 as a result of the rotational movement of the fan blades 114. Further, as illustrated in FIG. 5, in some implementations, the host circuit board 102 may additionally or alternatively include one or more openings 506 (e.g., holes, slots, or similar features) oriented such that the cooling fluid (e.g., air) may additionally or alternatively be drawn into the cooling pump (e.g., fan) from the opposite side of the host circuit board 102, e.g., as illustrated by air flow indicators 508 (or forced by the cooling pump to the opposite side of the host circuit board 102). As further illustrated in FIG. 5, in some such implementations, a shroud 502 may additionally or alternatively be disposed on the opposite side of the host circuit board 102, e.g., supported via standoffs 504 to form a space between the host circuit board 102 and the shroud 502, such that the cooling fluid (e.g., air) may be directed over components (not illustrated) on the opposite side of the host circuit board 102. Such configurations may thus allow cooling of surfaces and components on both sides of the host circuit board 102 using the same cooling pump (e.g., fan).

Although not illustrated in FIGS. 2-4, it should be appreciated that the host circuit boards 102 shown in those figures may likewise include similar components to facilitate the flow of fluid (e.g., air) into the fan and/or to direct the flow of fluid (e.g., air) toward one or more to-be cooled components 104 supported by the host circuit board 102.

As illustrated in FIG. 2, in some implementations, the rotor components of the cooling pump (e.g., fan) may be readily placed onto the host circuit board 102 (e.g., using a pick-and-place technique) by inserting the hub component 202 into a preformed hole 208 in the host circuit board 102 which is centrally located with respect to the circuit traces 122 that form the stator windings on the host circuit board 102. In some implementations, the hub component 202 may include one or more flanges 210 and/or other features that may allow the hub to lock into the hole 208 of the host circuit board 102 upon insertion. In the illustrated example, a vacuum tube 212 of a pick-and-place apparatus is being used to apply suction to a planar upper surface of the hub component 202, as well as to move the hub component 202 toward the hole 208. FIG. 3, illustrates how the completed assembly (including a host circuit board 102 and a rotor/fan assembly) may appear following the pick-and-place process illustrated in FIG. 2

FIG. 4 shows a completed assembly similar to that shown in FIG. 3, but in which the host circuit board 102 has a back-iron component 402 placed on a side of the host circuit board 102 that faces away from the rotor/fan assembly. Such a back-iron component 402 could likewise be placed on the opposite side of the host circuit board 102 shown in FIGS. 1 and 5 in a similar fashion. The inclusion of such a back-iron component 402 can help guide the magnetic flux from the one or more permanent magnets 108 through the active area of the stator windings formed by the circuit traces 122, thus improving the performance of the axial flux motor that is integrated on the host circuit board 102.

The following clauses describe example implementations of apparatuses and methods in accordance with some aspects of the present disclosure.

Clause 1. An apparatus, comprising: a host circuit board including one or more traces forming one or more windings for an axial flux motor, the one or more windings being configured to generate first magnetic flux within an active region of the axial flux motor when energized with current; at least a first heat-producing electronic component supported by the host circuit board; a rotor for the axial flux motor, the rotor being supported by and rotatable relative to the host circuit board, the rotor being configured to generate second magnetic flux within the active region; and one or more fan blades supported by the rotor to generate a flow of cooling fluid to cool the first heat-producing electronic component.

Clause 2. The apparatus of clause 1, further comprising: a shroud supported by the host circuit board, the shroud covering at least a portion of the rotor and including at least a first opening to allow entry of the cooling fluid into the shroud as a result of rotational motion of the one or more fan blades.

Clause 3. The apparatus of clause 2, further comprising: a duct supported by the host circuit board, the duct being configured to channel the cooling fluid from the shroud to the first heat-producing electronic component.

Clause 4. The apparatus of any of clauses 1-3, further comprising a hub component configured to be attached to the host circuit board and the rotor, the hub component including at least one first feature that allows rotation of the rotor relative to the host circuit board.

Clause 5. The apparatus of clause 4, wherein the hub component includes at least one second feature that allows the hub component to be inserted into an opening in the host circuit board.

Clause 6. The apparatus of clause 5, wherein the at least one second feature allows the hub component to lock into place on the host circuit board after being inserted into the opening.

Clause 7. The apparatus of clause 5 or claim 6, wherein the hub component includes at least one third feature that allows a pick-and-place apparatus to grasp the hub component and insert the hub component into the opening.

Clause 8. The apparatus of clause 7, in combination with the pick-and-place apparatus.

Clause 9. The apparatus of clause 8, wherein the pick-and-place apparatus includes a vacuum tube configured to apply a vacuum to the at least one third feature to grasp the hub component.

Clause 10. The apparatus of any of clauses 1-9, further comprising: a back-iron component positioned to receive at least a portion of the second magnetic flux generated by one or more permanent magnets on the rotor, the back-iron component being attached to a surface of the host circuit board that faces away from the rotor.

Clause 11. The apparatus of any of clauses 1-10, wherein the rotor includes a plurality of permanent magnets to generate the second magnetic flux.

Clause 12. The apparatus of any of clauses 1-11, wherein the host circuit board includes one or more holes configured and arranged to allow the one or more fan blades to cause at least a portion of the cooling fluid to flow from a first side of the host circuit board to a second side of the host circuit board opposite the first side.

Clause 13. The apparatus of clause 12, wherein the first heat-producing electronic component is disposed on the second side of the host circuit board.

Clause 14. The apparatus of clause 12 or 13, further comprising a second heat-producing electronic component disposed on the first side of the host circuit board, the second heat-producing electronic component being positioned to be cooled by the portion of the cooling fluid before the portion of the cooling fluid passes through the one or more holes.

Clause 15. The apparatus of clause 14, further comprising a second shroud disposed on the first side of the host circuit board, the second shroud being configured and arranged to cause the portion of the cooling fluid to pass over the second heat-producing electronic component.

Clause 16. A method, comprising: attaching at least a first heat-producing electronic component to a host circuit board that includes one or more traces forming one or more windings for an axial flux motor, the one or more windings being configured to generate first magnetic flux within an active region of the axial flux motor when energized with current; and attaching a rotor for the axial flux motor to the host circuit board so that the rotor is rotatable relative to the host circuit board, the rotor being configured to generate second magnetic flux within the active region and including one or more fan blades to generate a flow of cooling fluid to cool the first heat-producing electronic component.

Clause 17. The method of clause 16, further comprising: attaching a shroud to the host circuit board so that the shroud covers at least a portion of the rotor, the shroud including at least a first opening to allow entry of the cooling fluid into the shroud as a result of rotational motion of the one or more fan blades.

Clause 18. The method of clause 17, further comprising: attaching a duct to the host circuit board, the duct being configured to channel the cooling fluid from the shroud to the first heat-producing electronic component.

Clause 19. The method of any of clauses 16-18, further comprising: attaching the rotor to a hub component so that the rotor can rotate relative to the hub component; and attaching the hub component to the host circuit board.

Clause 20. The method of clause 19, wherein the hub component is attached to the host circuit board after the rotor is attached to the hub component.

Clause 21. The method of clause 19 or claim 16, wherein attaching the hub component to the host circuit board comprises inserting the hub component into an opening formed in host circuit board.

Clause 22. The method of clause 21, wherein hub component includes at least one feature that allows the hub component to lock into place on the host circuit board after being inserted into the opening.

Clause 23. The method of any of clauses 19-22, wherein attaching the hub component to the host circuit board comprises using a pick-and-place apparatus to grasp the hub component and move hub component toward the host circuit board.

Clause 24. The method of clause 23, wherein the pick-and-place apparatus includes a vacuum tube configured to apply a vacuum to a surface of the hub component.

Clause 25. The method of any of clauses 16-24, further comprising: positioning a back-iron component on a side of the host circuit board that faces away from the rotor so that the back-iron component receives at least a portion of the second magnetic flux generated by one or more permanent magnets on the rotor.

Clause 26. The method of any of clauses 16-25, wherein the rotor includes a plurality of permanent magnets to generate the second magnetic flux.

Clause 27. The method of any of clauses 16-25, further comprising: forming one or more holes in the host circuit board to allow the one or more fan blades to cause at least a portion of the cooling fluid to flow from a first side of the host circuit board to a second side of the host circuit board opposite the first side.

Clause 28. The method of clause 27, wherein attaching the first heat-producing electronic component to the host circuit board includes: attaching the first heat-producing electronic component to the second side of the host circuit board.

Clause 29. The method of clause 27 or 28, further comprising: attaching a second heat-producing electronic component to the first side of the host circuit board, the second heat-producing electronic component being positioned to be cooled by the portion of the cooling fluid before the portion of the cooling fluid passes through the one or more holes.

Clause 30. The method of clause 29, further comprising: attaching a second shroud disposed to the first side of the host circuit board, the second shroud being configured and arranged to cause the portion of the cooling fluid to pass over the second heat-producing electronic component.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

Various aspects of the present disclosure may be used alone, in combination, or in a variety of arrangements not specifically discussed in the embodiments described in the foregoing and is therefore not limited in this application to the details and arrangement of components set forth in the foregoing description or illustrated in the drawings. For example, aspects described in one embodiment may be combined in any manner with aspects described in other embodiments.

Also, the disclosed aspects may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc. in the claims to modify a claim element does not by itself connote any priority, precedence or order of one claim element over another or the temporal order in which acts of a method are performed, but are used merely as labels to distinguish one claimed element having a certain name from another element having a same name (but for use of the ordinal term) to distinguish the claim elements.

Also, the phraseology and terminology used herein is used for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus, comprising:
   a host circuit board including one or more traces forming one or more windings for an axial flux motor, the one or more windings being configured to generate first magnetic flux within an active region of the axial flux motor when energized with current;
   at least a first heat-producing electronic component supported by the host circuit board;
   a rotor for the axial flux motor, the rotor being supported by and rotatable relative to the host circuit board, the rotor being configured to generate second magnetic flux within the active region; and
   one or more fan blades supported by the rotor to generate a flow of cooling fluid to cool the first heat-producing electronic component.

2. The apparatus of claim 1, further comprising:
   a shroud supported by the host circuit board, the shroud covering at least a portion of the rotor and including at least a first opening to allow entry of the cooling fluid into the shroud as a result of rotational motion of the one or more fan blades.

3. The apparatus of claim 2, further comprising:
a duct supported by the host circuit board, the duct being configured to channel the cooling fluid from the shroud to the first heat-producing electronic component.

4. The apparatus of claim 1, further comprising:
a hub component configured to be attached to the host circuit board and the rotor, the hub component including at least one first feature that allows rotation of the rotor relative to the host circuit board.

5. The apparatus of claim 4, wherein the hub component further includes at least one second feature that allows the hub component to be inserted into an opening in the host circuit board.

6. The apparatus of claim 5, wherein the at least one second feature allows the hub component to lock into place on the host circuit board after being inserted into the opening.

7. The apparatus of claim 6, wherein the hub component further includes at least one third feature that allows a pick-and-place apparatus to grasp the hub component and insert the hub component into the opening.

8. The apparatus of claim 7, in combination with the pick-and-place apparatus.

9. The apparatus of claim 8, wherein the pick-and-place apparatus includes a vacuum tube configured to apply a vacuum to the at least one third feature to grasp the hub component.

10. The apparatus of claim 1, further comprising:
a back-iron component positioned to receive at least a portion of the second magnetic flux generated by one or more permanent magnets on the rotor, the back-iron component being attached to a surface of the host circuit board that faces away from the rotor.

11. The apparatus of claim 1, wherein the rotor includes a plurality of permanent magnets to generate the second magnetic flux.

12. The apparatus of claim 1, wherein the host circuit board includes one or more holes configured and arranged to allow the one or more fan blades to cause at least a portion of the cooling fluid to flow from a first side of the host circuit board to a second side of the host circuit board opposite the first side.

13. The apparatus of claim 12, wherein the first heat-producing electronic component is disposed on the second side of the host circuit board.

14. The apparatus of claim 13, further comprising:
a second heat-producing electronic component disposed on the first side of the host circuit board, the second heat-producing electronic component being positioned to be cooled by the portion of the cooling fluid before the portion of the cooling fluid passes through the one or more holes.

15. The apparatus of claim 14, further comprising a second shroud disposed on the first side of the host circuit board, the second shroud being configured and arranged to cause the portion of the cooling fluid to pass over the second heat-producing electronic component.

16. A method, comprising:
attaching at least a first heat-producing electronic component to a host circuit board that includes one or more traces forming one or more windings for an axial flux motor, the one or more windings being configured to generate first magnetic flux within an active region of the axial flux motor when energized with current; and
attaching a rotor for the axial flux motor to the host circuit board so that the rotor is rotatable relative to the host circuit board, the rotor being configured to generate second magnetic flux within the active region and including one or more fan blades to generate a flow of cooling fluid to cool the first heat-producing electronic component.

17. The method of claim 16, further comprising:
attaching a shroud to the host circuit board so that the shroud covers at least a portion of the rotor, the shroud including at least a first opening to allow entry of the cooling fluid into the shroud as a result of rotational motion of the one or more fan blades.

18. The method of claim 17, further comprising:
attaching a duct to the host circuit board, the duct being configured to channel the cooling fluid from the shroud to the first heat-producing electronic component.

19. The method of claim 16, further comprising:
attaching the rotor to a hub component so that the rotor can rotate relative to the hub component; and
attaching the hub component to the host circuit board.

20. The method of claim 19, wherein the hub component is attached to the host circuit board after the rotor is attached to the hub component.

21. The method of claim 19, wherein attaching the hub component to the host circuit board comprises inserting the hub component into an opening formed in host circuit board.

22. The method of claim 21, wherein hub component includes at least one feature that allows the hub component to lock into place on the host circuit board after being inserted into the opening.

23. The method of any of claim 22, wherein attaching the hub component to the host circuit board comprises using a pick-and-place apparatus to grasp the hub component and move hub component toward the host circuit board.

24. The method of claim 23, wherein the pick-and-place apparatus includes a vacuum tube configured to apply a vacuum to a surface of the hub component.

25. The method of claim 16, further comprising:
positioning a back-iron component on a side of the host circuit board that faces away from the rotor so that the back-iron component receives at least a portion of the second magnetic flux generated by one or more permanent magnets on the rotor.

26. The method of claim 16, wherein the rotor includes a plurality of permanent magnets to generate the second magnetic flux.

27. The method of claim 16, further comprising:
forming one or more holes in the host circuit board to allow the one or more fan blades to cause at least a portion of the cooling fluid to flow from a first side of the host circuit board to a second side of the host circuit board opposite the first side.

28. The method of claim 27, wherein attaching the first heat-producing electronic component to the host circuit board includes:
attaching the first heat-producing electronic component to the second side of the host circuit board.

29. The method of claim 28, further comprising:
attaching a second heat-producing electronic component to the first side of the host circuit board, the second heat-producing electronic component being positioned to be cooled by the portion of the cooling fluid before the portion of the cooling fluid passes through the one or more holes.

30. The method of claim 29, further comprising:
attaching a second shroud disposed to the first side of the host circuit board, the second shroud being configured and arranged to cause the portion of the cooling fluid to pass over the second heat-producing electronic component.

\* \* \* \* \*